United States Patent [19]
Faulconer

[11] Patent Number: 6,071,655
[45] Date of Patent: Jun. 6, 2000

[54] GLAZED PHOTO-RELIEF IMAGE

[76] Inventor: Keith Adams Faulconer, 9817 Chapala Dr. NE., Albuquerque, N. Mex. 87111-4863

[21] Appl. No.: 09/249,428

[22] Filed: Feb. 12, 1999

[51] Int. Cl.[7] ................................................ G03C 1/72
[52] U.S. Cl. ............................... 430/11; 430/18; 430/305; 430/306
[58] Field of Search ................................ 430/11, 18, 305, 430/306

[56] References Cited

U.S. PATENT DOCUMENTS 4,111,960  9/1978  Sam ......................................... 430/306

Primary Examiner—Hoa Van Le

[57] ABSTRACT

The present invention pertains to a new type of continuous-tone, photographic print comprising a continuous-tone, photographic relief on a substrate, filled with translucent glaze in such a manner that the thickness of said glaze is determined at any given location on the surface of the substrate by the depth of said relief at that location, and the thickness of said glaze determines the optical density of said print at that same location. Hence, it provides a type of continuous-tone, photographic print that can be formed on the surface of any suitable material, that is intrinsic to the surface of said material and as durable and as colorfast as the materials of which it is formed.

6 Claims, No Drawings

GLAZED PHOTO-RELIEF IMAGE

FIELD OF THE INVENTION

The present invention pertains to continuous-tone, photographic prints, and in particular, to a new type of continuous-tone, photographic print comprising a continuous-tone, photographic relief on a substrate filled with a translucent glaze in such a manner that the thickness of said glaze at any given point is determined by the depth of said relief.

BACKGROUND OF THE INVENTION

Since the discovery of photography in the first half of the nineteenth century, numerous and varied methods of printing photographic images on solid surfaces have been developed and employed. In all these methods, the image is formed by the application to a smooth and photographically unvariegated surface a layer of pigment or other colorant in such a manner that of the light striking the surface at any given location, the amount that is reflected, is inversely proportional to the amount of colorant at that location, and the distribution of said colorant on the surface corresponds to the shadows, midtones, and highlights of the photographic image. Except in the cases where a photo-sensitive emulsion is applied to the surface and subsequently exposed and developed, and in screen printing, all these methods utilize the transference, in one or more stages, of the colorant from the surface of a printing plate or matrix that predetermines the final distribution of said colorant, to the surface of the final object. Except in the photo-chemical processes, Woodbury-type, dye transfer, and, to a lesser extent, photogravure, all of the methods employ a nearly uniform film of colorant that is distributed in a minute pattern of dots, the size and proximity of which control the reflectivity of any given location in the image. This pattern of dots is called a half-tone screen.

In the now-obsolete Woodburytype process, a photographic relief is made by exposing thick, photo-sensitive dichromated gelatin film to an actinic light source through a continuous-tone, photographic negative. After washing out the unexposed portions of the gelatin with hot water and drying, the result is a relief image in tough, insoluble gelatin, thick in the shadow areas and progressively thinner in the midtones and highlights. An intaglio printing mold is made by forcing an impression of said relief into a lead plate in a hydraulic press. This mold is then filled with warm pigmented gelatin solution and a sheet of prepared paper is laid over it. A platen is then brought down over all. This forces the gelatin into the corners and interstices of the mold and surface of the paper and the excess gelatin out along the sides. When the gelatin is cooled and jelled, the paper is removed from the mold and allowed to dry. When dry the pigmented gelatin forms a tough film on the surface of the paper that is thicker and darker in the shadows and progressively thinner and lighter in the midtones through the highlights.

Photo-polymers are synthetic materials that harden and become solid and/or insoluble on exposure to light. They are used to make flexographic printing plates, rubber stamps, and molds for casting plaques and similar items. When exposed to light they harden away from the exposed surface so the greater the exposure is, the thicker the hardened area. Photo-polymer processes use high contrast litho film that, after exposing and developing has opaque areas and clear areas; it does not have shaded or gray areas. When a photo-polymer is exposed through one of these high contrast films it only hardens under the areas in the film that are clear, creating a non-continuous-tone, photographic relief. Photogravure and rotogravure are the only other known processes which use continuous-tone film to produce a continuous-tone relief, both of which use either a grained or screened pattern which tends to break the image up into dots, similar to the half-tone processes, and both transfer the colorant, in these cases ink, from the intaglio relief onto a separate substrate to produce the final object.

Ceramists and potters have long known that indentations and variations in ceramic surfaces affect the depth and color of overlying glazes. They have utilized this property in the decoration of their manufactures by incising, carving and impressing patterns and designs on the surfaces of the clays and molds, which are brought out and enhanced by the types and manner of application of glazes. There are fine Danish plates that have delicate hand carved intaglio images pressed into their surfaces and filled with a blue glaze that appear to be individually hand painted.

Basse-taille, a beautiful, jewel-like enameling, often done on silver, utilizes the same principle with a finely sculpted surface underlying a translucent enamel glaze.

No known photo-chemical or photo-mechanical printing techniques utilize a glaze-filled, continuous-tone relief as the final image. Only gravure and Woodburytype utilize varying the thickness of the colorant to control reflectivity, and they are both transfer processes: the intaglio relief that determines the thickness of the layer of colorant is a type of printing plate, a means to an end, not the final object. No known glazing or enameling techniques utilize a photographically formed continuous-tone underlying relief.

The previously unattempted combination of a photographically formed, continuous-tone relief filled with a translucent glaze determines the thickness or depth of the colorant or glaze by the depth of the relief in the surface of the final object itself. This creates a beautiful, continuous-tone photographic image which, depending upon the materials used, can be extremely durable and colorfast as well.

SUMMARY OF THE INVENTION

The present invention describes a new and unique type of continuous-tone, photographic print comprising a continuous-tone, photographic relief on a suitable, formable substrate which is filled with a translucent glaze in such a manner that the thickness of said glaze is determined at any given location on the surface of said substrate by the depth of said relief at that location. A continuous-tone, photographic relief is defined as any surface that is so formed that its surface depth varies in proportion, point by point, to the optical density of any given continuous-tone, photographic image where a continuous-tone, photographic image is defined as any image in which tonal gradations of color density are visually distinguishable between the extremes of dark and light areas and the image forms a record of an optical image, at the focal plane of a lens on photographic film, or in any other manner. Hence, the surface of said substrate is cast as a relief of the optical densities of a photographic image. When said surface is filled with a translucent glaze the visual image becomes apparent. For the purposes of this patent, a glaze shall be defined as any translucent coating material.

For example if said substrate is a white ceramic clay the darker or shadow areas of the image are physically deeper in the surface than the gray or midtone areas and the highlights are very shallow, so if said surface is filled with a dark colored translucent ceramic glaze the shadows appear dark because the glaze is thickest in the deep shadow areas the midtones are thinner and lighter and the highlights are thinnest and lightest. A reverse or negative effect obtains if the substrate is dark and the translucent filler is light or "milky". Various duotone effects can be created by using different colors in the substrate and translucent filler or multiple fillers. All manner of photographic masking and manipulation can be used prior to the formation of the relief to create desired effects.

An object of the invention is a to provide a new and useful type of continuous-tone, photographic print on the surfaces of suitable manufactures that is intrinsic to the surface rather than applied on it.

Another object of the invention is to provide a new type of continuous-tone, photographic print that can be composed of exceedingly durable and colorfast materials.

Another object of the invention is to provide a new type of continuous-tone, photographic print that can be reproduced by numerous conventional forming processes which include injection molding, slip casting, investment casting, die casting, tile pressing, etc, subsequently filled with a translucent glaze.

Another object of the invention is to provide a new type of continuous-tone, photographic print that is truly continuous-tone rather than broken up into dots as in the half-tone processes.

DESCRIPTION OF THE PREFERRED EMBODIMENTS

One embodiment is a decorative ceramic tile comprising a continuous-tone, photographic relief as defined in the summary above, on a ceramic tile filled with colored translucent ceramic glaze.

First a positive transparency (a well-exposed 35 mm slide is suitable) of the desired image is chosen and enlarged onto continuous tone film. A liquid photo-polymer which has a very steep density-to-exposure curve, ie. high contrast, will be exposed through this negative, so it is necessary to expose and develop the negative to a very low contrast. A long exposure with a short flash exposure in conjunction with moderate development time in diluted developer produces a suitably "flat" negative on typical professional black-and-white film. Still and water-bath developing techniques might also be used to advantage. On a light table, thick dense foam adhesive tape of the type sold as weather stripping, is adhered to the emulsion side of the film so that it forms a rectangular frame around the desired portion of the image. The film is then placed emulsion side up on a level sheet of plate glass above an open arc light in a black box. A modified lithographic plate burner with the reflector spray painted black works well. To insure the sharpest detail, it is necessary that the light emanates as much as possible from a single point to minimize light scatter in the photo-polymer and a consequent loss of resolution.

Said liquid photo-polymer is then poured onto the negative so that it fills the area within the foam tape frame to a depth of about 1/8". The arc is energized and the exposure is visually monitored through dark glasses. As the photo-polymer hardens its light refractive characteristics change so that the hardened portions become visibly distinct from the unhardened areas. When the photo-polymer above the darkest areas of the negative begins to harden the exposure is complete. The negative, with the exposed photo-polymer is then placed in a photo tray of warm developing solution which washes out the unexposed photo-polymer leaving a positive, continuous-tone photographic relief matrix.

After drying, this matrix, which is slightly tacky, is gently stripped away from the negative and laid, relief side up, on a sheet of clean dry plate glass, care being taken to avoid trapping air beneath it. This now forms the bottom of a mold, the sides of which are made of four 1/4" by 1" by 10" machined steel bars with sharp square corners laid flat on said sheet of glass and joined end to side so that they form a rectangle around said matrix. The tops of the joints are then taped together with thin adhesive tape. An RTV liquid silicone rubber medium is prepared according to its' manufacturers directions and poured into the mold until the mold is just slightly over-filled. Then another sheet of clean dry plate glass approximately two inches larger in each direction than the mold cavity is centered down on top of the mold with a slight rolling motion to expel the air, and weighted down so that the glass settles into close contact with the mold. After the silicone has cured, the mold is carefully disassembled, disgorging a silicone pattern with a negative, continuous-tone relief surface.

After the flashing is trimmed from the pattern with a razor blade, the back of the pattern is lightly coated with a thin viscous substance (diluted corn syrup works well), and reapplied to the center of the sheet of plate glass that was used as the top of the mold. The corn syrup causes the pattern to lightly adhere to the glass. For the next step a flask in the form of a strong rectangular frame, approximately 1" high and 1" larger in each direction than the silicone pattern is placed down on the glass so that the silicone pattern is approximately centered within it. This flask must be sufficiently heavy to remain stationary when filled with plaster. A quantity of plaster of paris sufficient to fill said flask is prepared and poured into the flask until the flask is just slightly over filled. Then a clean sheet of glass, larger in each direction than the flask is lowered with a gentle rolling motion onto the center of the flask until it forces out all of the excess plaster and comes into contact with the edges of the flask. After the plaster has set both sheets of glass and the silicone pattern are gently pried away from the plaster and removed leaving a plaster mold within the flask, that has a positive, continuous-tone relief surface.

When the plaster has dried, white ceramic clay is pressed into the mold. Sufficient clay to just slightly overfill the mold is pressed into the mold with the fingers and formed so that the center is higher than the edges. The mold is then placed in a screw press, a sheet of smooth, non-absorbant material (1/4" acrylic plexiglass works well) is placed over the mold and the platen of the press is brought down on it with sufficient force to press the clay tightly into the mold and squeeze out the excess. After about ten minutes, depending on the temperature and humidity, the clay will shrink enough so that it will fall out of the inverted mold with a slight tap. The tile will still be adhered to the sheet of acrylic and a knife is used to trim away the thin flashing of clay. After about thirty minutes, the tile can be gently pried off the acrylic and left to dry face up on a flat porous surface until it is bone dry. Every precaution should be taken to ensure that the tile remains flat. If it dries too rapidly it can warp, so a cool, slightly humid environment is beneficial. When dry, the tile is fired in a kiln to a bisque state.

After the tile has cooled, it is placed face up on a level surface. A tinted translucent glaze is prepared to a slightly runny consistency (pre-prepared semitransparent gloss glazes can be used) and brushed onto the surface of the tile until the surface is filled. It is essential that the surface of the glaze at this stage is smooth and level. When the glaze has dried, the tile is fired again in the kiln until the glaze flows. The glaze now forms a positive continuous-tone photographic print. Multiple glazes can also be applied.

The strength of the color in the glaze(s) must be matched to the relative depths of the shadow and highlight areas of the relief to achieve the desired contrast, because the depth of the relief determines the thickness of the glaze at any given point. Establishing standardized densitometric high and low end values for the negative transparency used to expose the photopolymer, and establishing a standard exposure for the photo-polymer will facilitate standardizing the strength of the color in the glaze.

In another embodiment the substrate is injection molded plastic filled with tinted plastic resin.

In another embodiment the substrate is investment or lost wax cast silver filled with translucent enamel in the manner of basse-taille enameling.

In other embodiments the substrates are metal or metal alloy, plastic polymer, or glass filled with translucent plastic polymer or glass.

Although in the last embodiments listed above detailed production procedures are not given, the required techniques are well known by persons skilled in the related arts.

While the above listed embodiments are currently considered preferred, it will be appreciated that the materials and techniques that could be adapted to serve in modified embodiments are too numerous to enumerate. Further, it will be appreciated that alternate methods of creating continuous-tone photographic reliefs superior to the method described above may be developed by persons skilled in the related arts, including methods utilizing digital engraving and/or lasers. It is therefore desired that the invention not be limited to these embodiments, and it is intended to cover in the appended claims all such modifications which fall within the true spirit and scope of the invention.

What is claimed is:

1. A continuous-tone, photographic print comprising a substrate that has a continuous-tone, photographic relief filled with a translucent glaze in such a manner that the thickness of said glaze is determined at any given location on the surface of the substrate by the depth of said relief at that location, and the surface depth of said relief varies in proportion, point by point, to the optical densities of any given continuous-tone, photographic image.

2. A continuous-tone, photographic print as defined in claim 1, in which said substrate is ceramic clay and said glaze is ceramic glaze.

3. A continuous-tone, photographic print as defined in claim 1, in which said substrate is a metal or metal alloy and said glaze is a fired enamel.

4. A continuous-tone, photographic print as defined in claim 1, in which said substrate is a metal or metal alloy and said glaze is a plastic polymer.

5. A continuous-tone, photographic print as defined in claim 1, in which both said substrate and said glaze are plastic polymers.

6. A continuous-tone, photographic print as defined in claim 1, in which both said substrate and said glaze are glass.

* * * * *